(12) United States Patent
Suh et al.

(10) Patent No.: US 7,442,960 B2
(45) Date of Patent: Oct. 28, 2008

(54) TFT, METHOD OF MANUFACTURING THE TFT, FLAT PANEL DISPLAY HAVING THE TFT, AND METHOD OF MANUFACTURING THE FLAT PANEL DISPLAY

(75) Inventors: Min-Chul Suh, Seongnam-si (KR); Nam-Choul Yang, Seoul (KR); Jae-Bon Koo, Yongin-si (KR); Tae-Min Kang, Suwon-si (KR); Hye-dong Kim, Seongnam-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/131,233

(22) Filed: May 18, 2005

(65) Prior Publication Data

US 2005/0258487 A1 Nov. 24, 2005

(30) Foreign Application Priority Data

May 22, 2004 (KR) .................. 10-2004-0036635

(51) Int. Cl.
*H01L 21/84* (2006.01)
(52) U.S. Cl. .................. 257/66; 257/72; 257/59; 257/347; 257/E27.062; 257/E27.111; 438/149
(58) Field of Classification Search .......... 257/72, 257/59, 347, 66; 438/149, 479, 517, 48
See application file for complete search history.

(56) References Cited

U.S. PATENT DOCUMENTS

| | | | | |
|---|---|---|---|---|
| 6,707,107 B2* | 3/2004 | Kido | ............ | 257/354 |
| 6,838,321 B2* | 1/2005 | Kaneda et al. | ............ | 438/133 |
| 2001/0024863 A1 | 9/2001 | Bolam et al. | | |
| 2002/0145144 A1 | 10/2002 | Kane et al. | | |
| 2004/0239838 A1* | 12/2004 | Lai | ............ | 349/106 |
| 2005/0001968 A1* | 1/2005 | Yamazaki et al. | ............ | 349/152 |
| 2005/0082492 A1* | 4/2005 | Lin et al. | ............ | 250/370.14 |

(Continued)

FOREIGN PATENT DOCUMENTS

EP 1 286 392 A2 2/2003

(Continued)

OTHER PUBLICATIONS

Ioannis Kymissis, et al., Patterning Pentacene Organic Thin Film Transistors, 2002 American Vacuum Society, J. Vac. Sci. Technol. B 20(3), May/Jun. 2002, pp. 956-959.

(Continued)

*Primary Examiner*—Ahmed Sefer
(74) *Attorney, Agent, or Firm*—H.C. Park & Associates, PLC

(57) ABSTRACT

A thin film transistor (TFT) including a semiconductor film that may be simply patterned, a method of manufacturing the TFT, a flat panel display (FPD) including the TFT, and a method of manufacturing the FPD. The TFT includes a gate electrode, source and drain electrodes electrically insulated from the gate electrode, and a semiconductor film electrically insulated from the gate electrode and including source and drain regions coupled to the source and drain electrodes, respectively, and a channel region coupling the source and drain regions. The semiconductor film has a groove that isolates the channel region from an adjacent TFT.

25 Claims, 9 Drawing Sheets

U.S. PATENT DOCUMENTS

2005/0099551 A1* 5/2005 Yang et al. .................. 349/43
2005/0189876 A1* 9/2005 Yamazaki et al. .......... 313/506
2005/0214983 A1* 9/2005 Maekawa .................. 438/149
2006/0197084 A1* 9/2006 Tanabe ...................... 257/57

FOREIGN PATENT DOCUMENTS

WO     WO 2004/040657     *     5/2004

OTHER PUBLICATIONS

T.K.S. Wong, et al., Patterning of poly(3-alkylthiophene) thin films by direct-write ultraviolet laser lithography, Materials Science and Engineering B55 (1998), pp. 71-78.

Yoichiroh Hosokawa, et al., Femtosecond Multistep Laser Etching of Transparent Amorphous Organic Film, Japanese Journal of Applied Physics, Publication Office Japanese Journal of Applied Physics, Tokyo, Japan, vol. 40, No. 10B, part 2, Oct. 15, 2001, pp. L1116-L1118.

International Search Report, Sep. 26, 2005.

* cited by examiner

TFT, METHOD OF MANUFACTURING THE TFT, FLAT PANEL DISPLAY HAVING THE TFT, AND METHOD OF MANUFACTURING THE FLAT PANEL DISPLAY

CROSS REFERENCE TO RELATED APPLICATION

This application claims priority to and the benefit of Korean Patent Application No. 10-2004-0036635, filed on May 22, 2004, which is hereby incorporated by reference for all purposes as if fully set forth herein.

BACKGROUND OF THE INVENTION

1. Field of the Invention

The present invention relates to a thin film transistor (TFT), a method of manufacturing a TFT, a flat panel display (FPD) including the TFT, and a method of manufacturing the FPD. More particularly, the present invention relates to a TFT that includes a semiconductor film that may be simply patterned, a method of manufacturing the TFT, an FPD with the TFT, and a method of manufacturing the FPD.

2. Discussion of the Background

Generally, a TFT may be used in FPDs, such as liquid crystal displays (LCDs), organic electroluminescent (EL) displays, and inorganic EL displays, as a switching device that turns pixels on and off and as a driving device that drives pixels.

A TFT typically includes a semiconductor film, a gate electrode, and source and drain electrodes. The semiconductor film may include heavily doped source and drain regions with a channel region formed therebetween. The gate electrode is electrically insulated from the semiconductor film and located above the channel region. The source and drain electrodes contact the source and drain regions, respectively.

Forming the source and drain electrodes of a metal having a small work function may obtain a smooth flow of charges. However, the metal may have a contact resistance with the semiconductor film, thereby degrading TFT characteristics and increasing power dissipation.

Thus, various methods for lowering this contact resistance have been developed and used. When using an amorphous silicon semiconductor film, an n+silicon film may be interposed between the semiconductor film and the metal source and drain electrodes to attain a smooth flow of electrons or holes. When using polysilicon semiconductor film, the semiconductor film may be doped with impurities to reduce the contact resistance.

A 300° C. or higher temperature may be required to form these conventional structures. However, these temperatures cannot be used with a plastic substrate, which is vulnerable to heat.

Thinner and more flexible FPDs are being manufactured. Much research into the use of plastic substrates is being conducted so that FPDs may be made highly flexible. But as described above, when a plastic substrate is used for a display, high-temperature processes should be avoided. Accordingly, it difficult to use a conventional polysilicon-based TFT.

To solve this problem, organic semiconductors have become more prevalent. An organic semiconductor film may be formed using a low-temperature process, thus enabling the use of organic TFTs.

Nevertheless, the organic semiconductor film cannot be patterned using a conventional patterning process, i.e., a photolithography process. The patterning process may be used to form an active channel, but it typically includes a wet or dry etching process, thus resulting in damage to the organic semiconductor.

Therefore, a new process for patterning semiconductor films is needed.

SUMMARY OF THE INVENTION

The present invention provides a TFT including a semiconductor film that may be simply patterned, an FPD including the TFT, and methods of manufacturing the TFT and the FPD.

Additional features of the invention will be set forth in the description which follows, and in part will be apparent from the description, or may be learned by practice of the invention.

The present invention discloses a TFT comprising a gate electrode, source and drain electrodes electrically insulated from the gate electrode, and a semiconductor active layer electrically insulated from the gate electrode and including source and drain regions coupled to the source and drain electrodes, respectively, and a channel region coupling the source and drain regions. The semiconductor active layer is separated by a groove from an adjacent semiconductor film.

The present invention also discloses a method for manufacturing a TFT comprising a gate electrode, source and drain electrodes electrically insulated from the gate electrode, and a semiconductor active layer electrically insulated from the gate electrode and including source and drain regions coupled to the source and drain electrodes, respectively, and a channel region coupling the source and drain regions. The method for manufacturing the TFT comprises forming the semiconductor active layer, and forming a groove in the semiconductor active layer that isolates the semiconductor active layer from an adjacent semiconductor film.

According to yet another aspect of the present invention, there is provided an FPD comprising a light emitting region having a plurality of pixels, each of the pixels comprising a plurality of selection driving circuits, each of the selection driving circuits comprising at least one TFT comprising a gate electrode; source and drain electrodes electrically insulated from the gate electrode; and a semiconductor film electrically insulated from the gate electrode and including source and drain regions which contact the source and drain electrodes, respectively, and a channel region which connects the source and drain regions. Herein, the semiconductor film has at least a groove which isolates the channel region from adjacent TFTs.

According to further another aspect of the present invention, there is provided a method of manufacturing an FPD comprising a light emitting region having a plurality of pixels, each of the pixels comprising a plurality of selection driving circuits, each of the selection driving circuits comprising at least one TFT comprising a gate electrode, source and drain electrodes electrically insulated from the gate electrode, and a semiconductor film electrically insulated from the gate electrode and including source and drain regions, which are in contact with the source and drain electrodes, respectively, and a channel region, which connects the source and drain regions. Herein, the method of manufacturing the FPD comprises forming the semiconductor film; and forming at least a groove in the semiconductor film to isolate at least the channel region from adjacent TFTs.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Hereinafter, exemplary embodiments of the present invention will be described with reference to the attached drawings.

Figure 1:
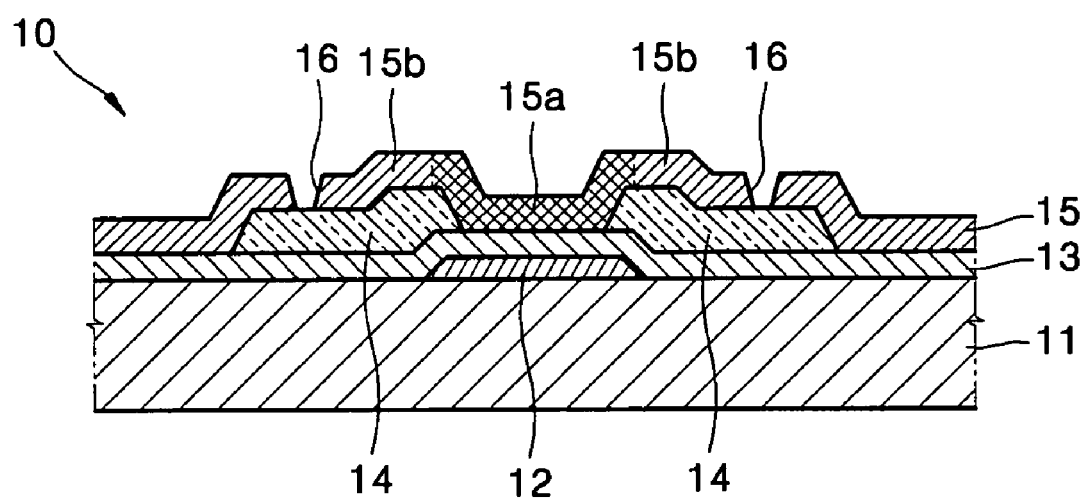
FIG. 1 is a cross-sectional view showing a TFT according to an exemplary embodiment of the present invention.

FIG. 1 is a cross-sectional view showing a TFT 10 according to an exemplary embodiment of the present invention.

Referring to FIG. 1, the TFT 10 may be formed on a substrate 11, which may be made of glass or plastic.

A gate electrode 12 is formed with a predetermined pattern on the substrate 11, and a gate insulating film 13 covers the gate electrode 12. Source and drain electrodes 14 are separately formed on the gate insulating film 13. Although they may partially overlap the gate electrode 12 as shown in FIG. 1, the present invention is not limited thereto. A semiconductor film 15 is formed on the source and drain electrodes 14.

The semiconductor film 15 includes source and drain regions 15b and a channel region 15a coupling the source and drain regions 15b. The source and drain regions 15b may be doped with n-type or p-type impurities, but the present invention is not limited thereto. The semiconductor film 15 may be formed of an n-type or p-type semiconductor and doped with n-type or p-type impurities.

The semiconductor film 15 may be formed of an inorganic or organic semiconductor. Preferably, the semiconductor film 15 is formed of an organic semiconductor.

The inorganic semiconductor may be composed of CdS, GaS, ZnS, CdSe, CaSe, ZnSe, CdTe, SiC, or Si.

The organic semiconductor may be composed of a polymer material or a monomer material. The polymer material may be any one of the following or their derivatives: polythiophene, polyparaphenylenvinylene, polyparaphenylen, polyflorene, polythiophenevinylene, and a polythiophene-heterocyclic aromatic copolymer. The monomer material may be any one of the following or their derivatives: pentacene, tetracene, or oligoacene of naphthalene, alpha-6-thiophene, oligothiophene of alpha-5-thiophene, metal-containing or metal-free phthalocyanin, pyromelitic dianhydride, pyromelitic diimide, perylenetetracarboxylic acid dianhydride, and perylenetetracarboxylic diimide.

A groove 16 may be formed in the semiconductor film 15 to isolate the channel region 15a from adjacent TFTs. The semiconductor film 15 may be patterned by the groove 16 without any additional patterning process. Forming the semiconductor film 15 of organic semiconductor may more effectively isolate the channel region 15a from adjacent TFTs. As stated above, it may be difficult to pattern the organic semiconductor film because the patterning process may easily damage the organic material. However, in the present exemplary embodiment, the groove 16 isolates the channel region 15a from adjacent TFTs without using any additional patterning process. Therefore, since this isolation may be performed using only the groove 16, it is unnecessary to etch the entire semiconductor film 15 except an active channel, which shortens a manufacturing process and enhances manufacturing efficiency. Further, wet or dry etching processes are not required, thus simplifying the manufacturing process and improving TFT characteristics.

The groove 16 may be simply formed using a laser ablation method. Referring to FIG. 1, after forming the semiconductor film 15, a laser may be irradiated on the semiconductor film 15 to etch a predetermined portion of it. A method of forming the groove 16 is not limited to the above description, as other methods for forming a groove may be used.

Figure 2:
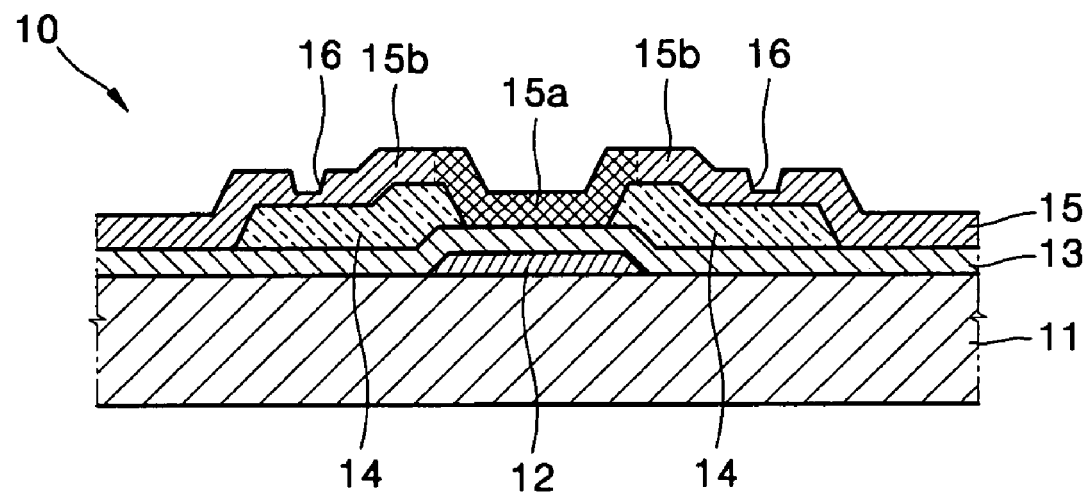
FIG. 2 and FIG. 3 are cross-sectional views showing modifications to the TFT shown in FIG. 1.

As shown in FIG. 1, the groove 16 may pass through the semiconductor film 15, but the present invention is not limited thereto. For example, as shown in FIG. 2, the groove 16 may be etched a predetermined depth into the semiconductor film 15 without contacting the source and drain electrodes 14 located thereunder. Alternatively, as shown in FIG. 3, the groove 16 may extend into the source and drain electrodes 14.

Referring to FIG. 2, the groove 16 may have a depth that is about 10 nm less than the thickness of the semiconductor film 15, but the present invention is not limited thereto. As long as the groove 16 is deep enough to block the flow of carriers, the channel region 15a may be isolated from adjacent TFTs. Accordingly, as shown in FIG. 2, the groove 16 may have a depth that is less than or equal to the thickness of the semiconductor film 15.

Figure 3:
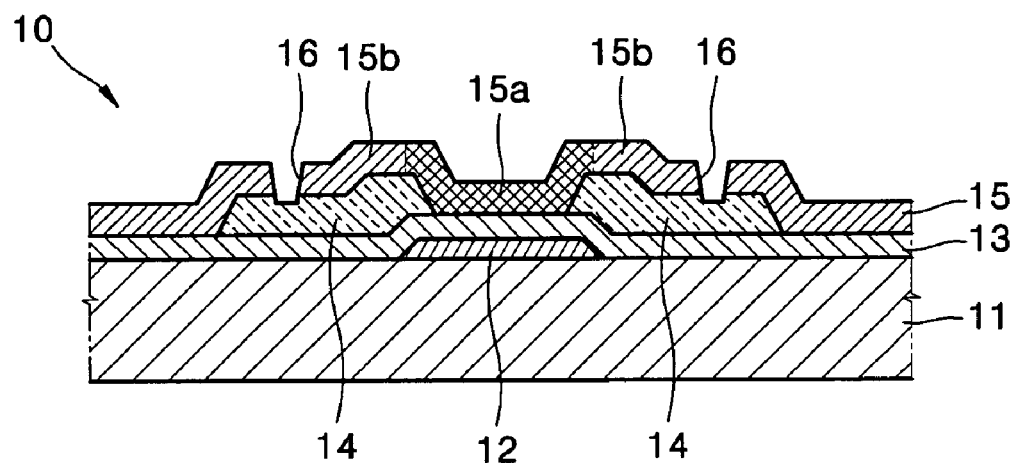

Additionally, as FIG. 3 shows, the groove 16 may extend into the source and drain electrodes 14.

FIG. 4, FIG. 5, FIG. 6, FIG. 7, FIG. 8, FIG. 9, FIG. 10, FIG. 11, FIG. 12 and FIG. 13 are exemplary embodiments showing various forms for the groove 16. In FIGS. 4 through 13, reference character 12a refers to a gate interconnection via which a gate signal is transmitted to the gate electrode 12, and reference character 14a refers to an interconnection, which may be connected to either the source or drain electrode.

Figure 4:
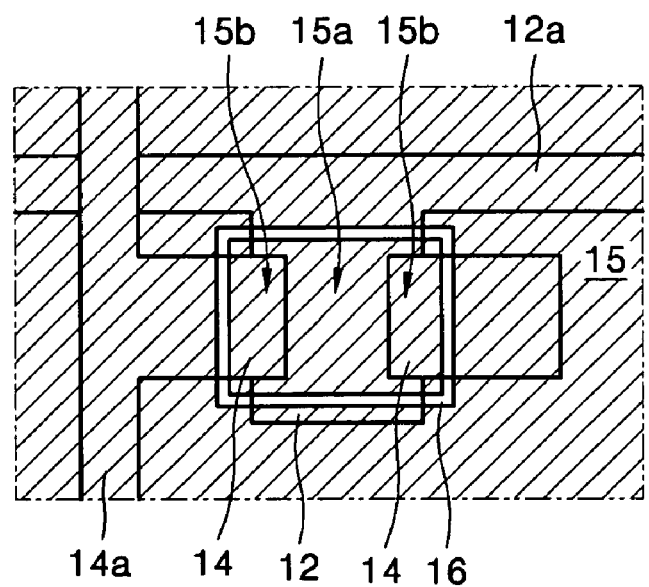
FIG. 4, FIG. 5, FIG. 6, FIG. 7, FIG. 8, FIG. 9, FIG. 10, FIG. 11, FIG. 12 and FIG. 13 are plan views showing various examples of a groove shown in FIG. 1.
Figure 5:
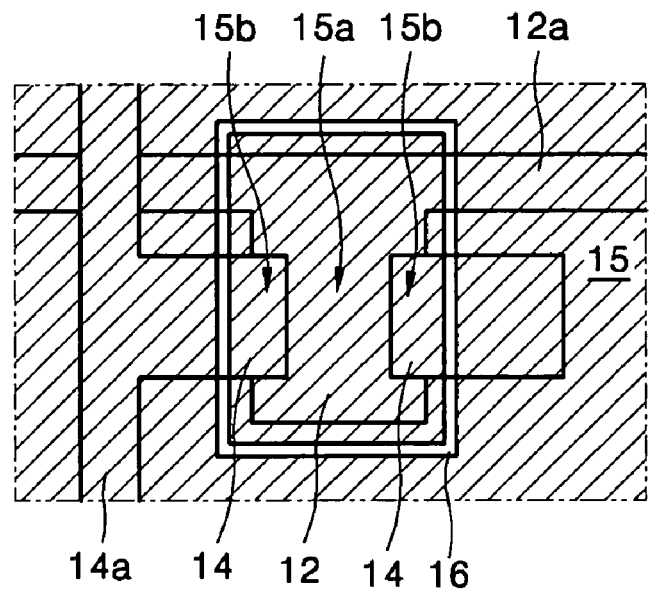

FIG. 4 and FIG. 5 show the groove 16 in the form of a closed curve, and the channel region 15a may be located inside the closed curve.

As FIG. 4 shows, the groove 16 having the form of the closed curve may partially overlap the gate electrode 12, or as FIG. 5 shows, it may be formed outside the gate electrode 12. When it overlaps the gate electrode 12 as shown in FIG. 4, it may be located inside the gate interconnection 12a. When it is located outside the gate electrode 12 as shown in FIG. 5, it may run across the gate interconnection 12a.

Figure 6:
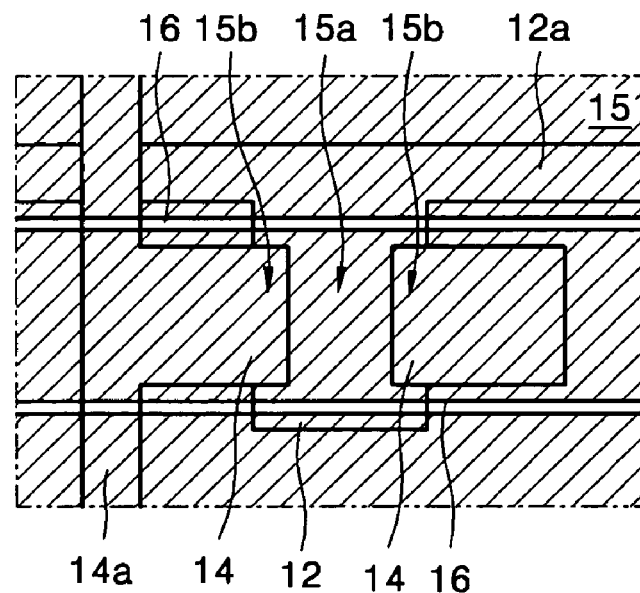
Figure 7:
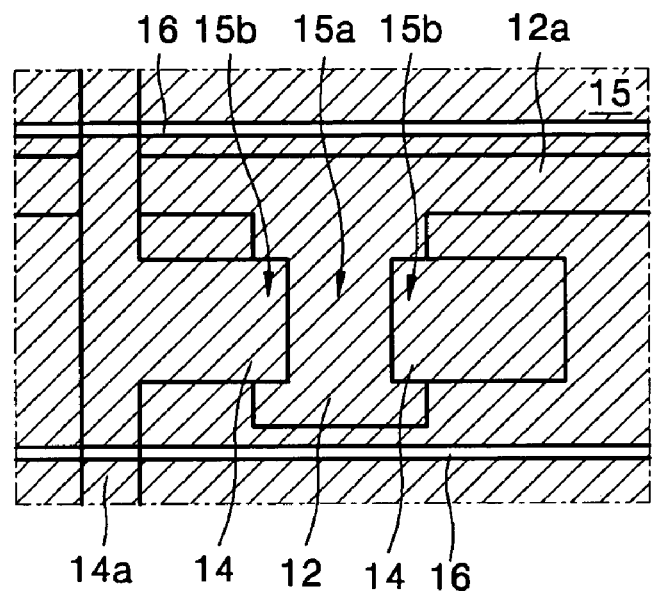
Figure 8:
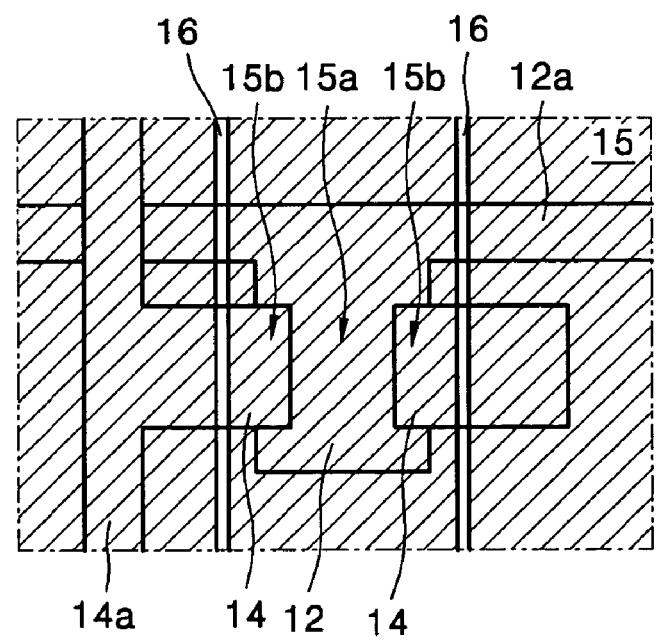
Figure 9:
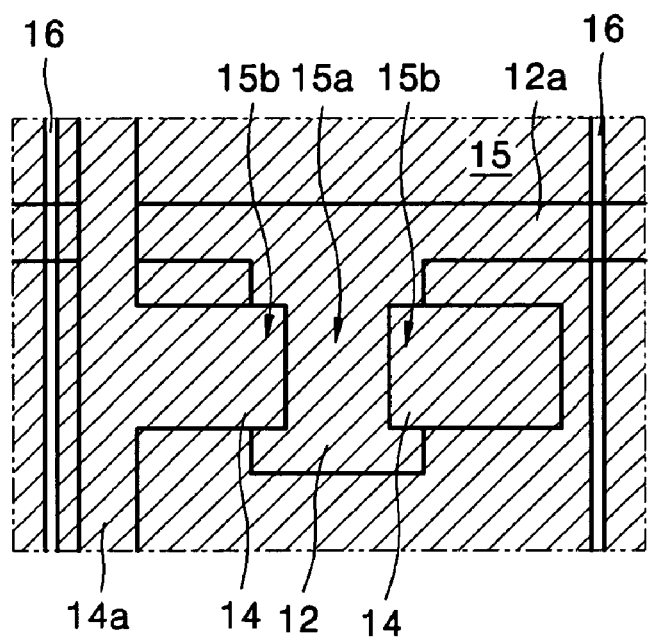

As FIG. 6, FIG. 7, FIG. 8 and FIG. 9 show, the groove 16 may have the form of a pair of parallel lines. In this case, the channel region 15a is located between the parallel lines. As FIG. 6 and FIG. 7 show, the lines may be parallel to the gate interconnection 12a, or as FIG. 8 and FIG. 9 show, they may be parallel to the interconnection 14a.

The groove 16 may be formed inside the gate interconnection 12a and across the gate electrode 12, as shown in FIG. 6, or it may be formed outside the gate interconnection 12a and outside the gate electrode 12, as shown in FIG. 7.

As FIG. 8 shows, the groove 16 may run across the source and drain electrodes 14, or as FIG. 9 shows, the source and drain electrodes 14 may be located inside the groove 16.

Figure 10:
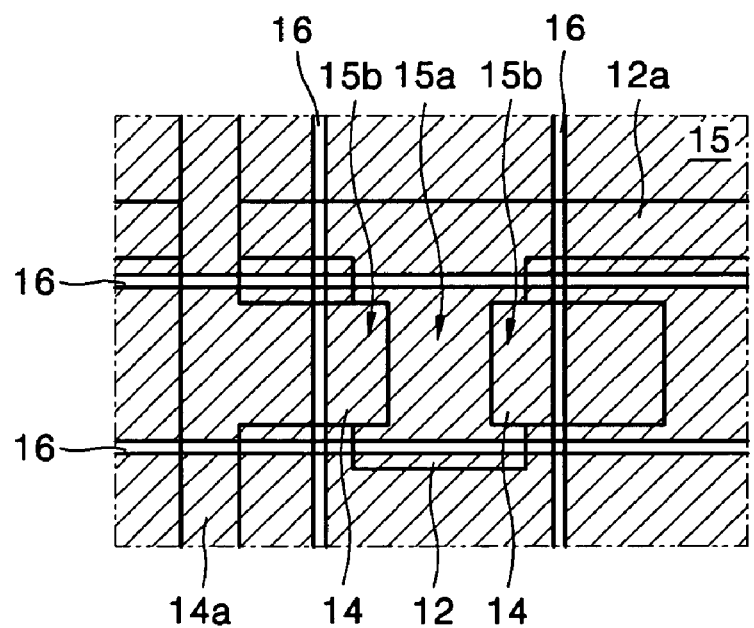
Figure 11:
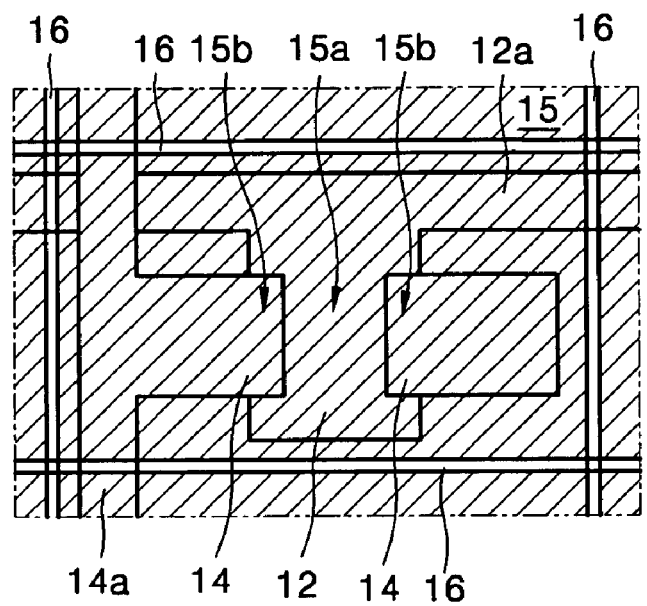
Figure 12:
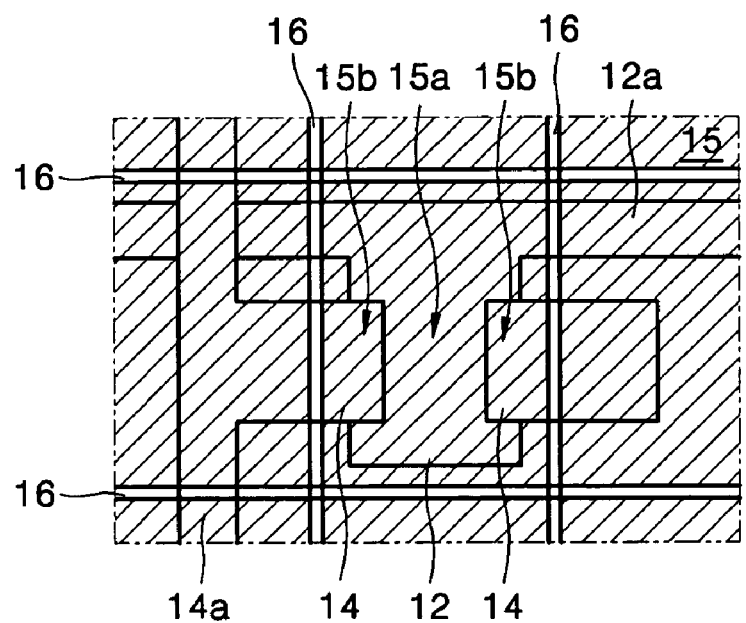
Figure 13:
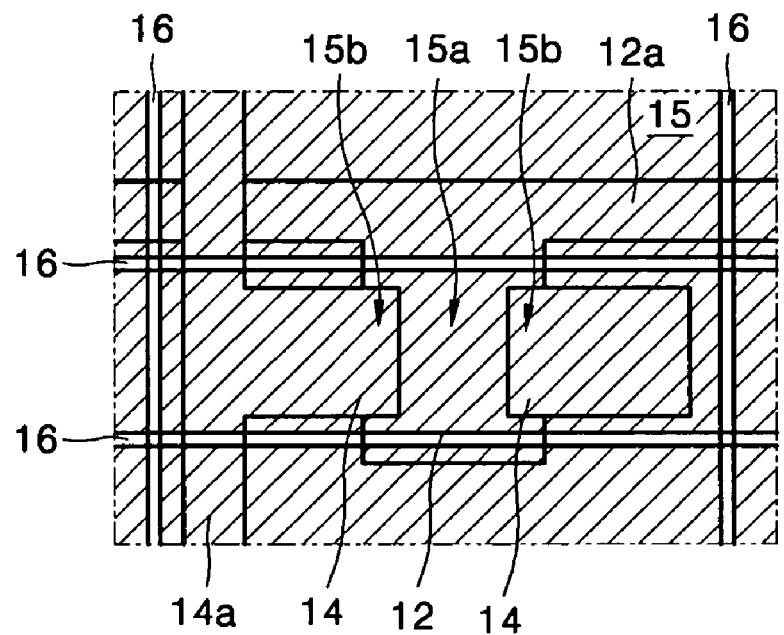

As FIG. 10, FIG. 11, FIG. 12 and FIG. 13 show, the groove 16 may be in the form of two pairs of parallel lines with the channel region 15a located between them. One pair may be parallel to the gate interconnection 12a, while the other pair may be parallel to the interconnection 14a. Additionally, as FIG. 10 shows, the groove 16 may run across the gate electrode 12 and the source and drain electrodes 14, or as FIG. 11 shows, they may be formed outside the gate electrode 12 and the source and drain electrodes 14. Alternatively, as FIG. 12 shows, the groove 16 may run across the source and drain electrodes 14 but not the gate electrode 12, or as FIG. 13 shows, the groove may run across the gate electrode 12, but not the source and drain electrodes 14.

As FIG. 4, FIG. 5, FIG. 6, FIG. 7, FIG. 8, FIG. 9, FIG. 10, FIG. 11, FIG. 12 and FIG. 13 show, the groove 16 may have a portion that is substantially parallel to a line that is connected to at least the source and drain regions 15b and the channel region 15a. Consequently, the length of the channel region 15a formed when the gate signal is transmitted to the gate electrode 12 is defined, thus improving the patterning effect of the semiconductor film 15.

In addition to the stacked structure shown in FIG. 1, the TFT of the present invention may have various stacked structures.

Figure 14:
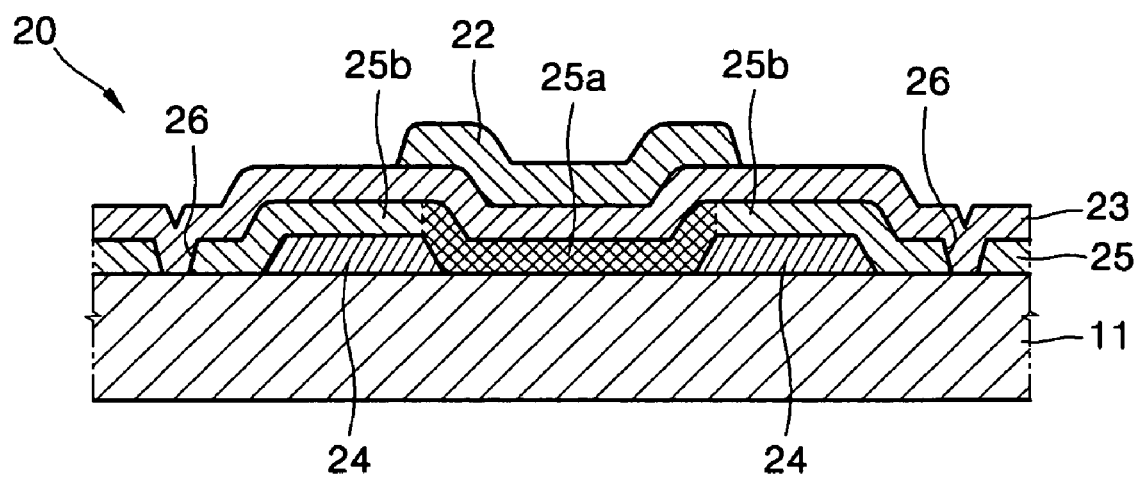
FIG. 14 is a cross-sectional view showing a TFT according to an exemplary embodiment of the present invention.

For example, FIG. 14 is a cross-sectional view showing a TFT 20 according to another exemplary embodiment of the present invention.

Referring to FIG. 14, source and drain electrodes 24 may be formed on a substrate 21, and a semiconductor film 25 may be formed to cover the source and drain electrodes 24.

A groove 26 may then be formed in the semiconductor film 25. Since the depth, form, and pattern structure of the groove 26 may be the same as in the previous exemplary embodiments, a detailed description thereof is not discussed here.

After forming the groove 26 in the semiconductor film 25, a gate insulating film 23 may be formed to cover the groove 26. A gate electrode 22 may be formed above a channel region 25a of the semiconductor film 25.

The above-described TFTs may be used in FPDs, such as liquid crystal displays (LCDs) or organic electroluminescent (EL) displays.

That is, the TFT according to exemplary embodiments of the present invention may serve as a switching TFT and/or a driving TFT for the FPDs, or it may be utilized in various driving circuits.

When using the TFT of the present invention as a driving TFT of an FPD, a pixel electrode of the FPD may be coupled to either the source or drain electrode.

Figure 15:
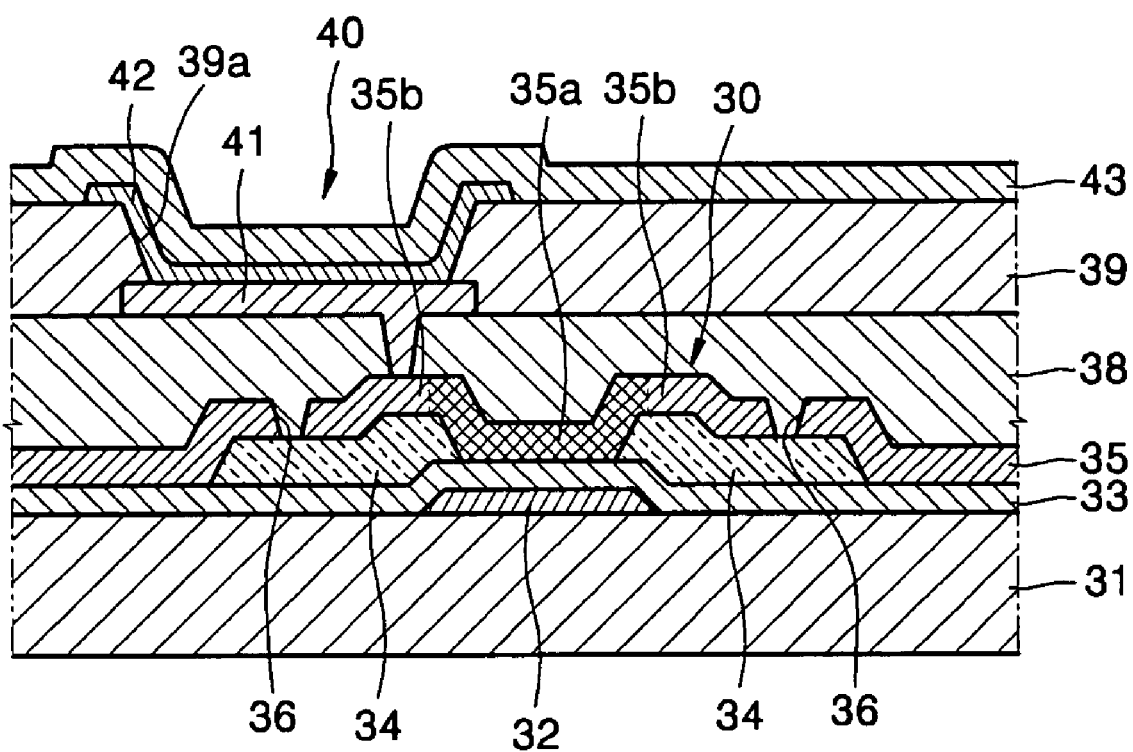
FIG. 15 is a cross-sectional view showing an organic EL display including the TFT shown in FIG. 1.

FIG. 15 is a cross-sectional view showing a subpixel of an organic EL display including the above-described TFT.

Referring to FIG. 15, the subpixel includes an organic light emitting device (OLED) as a self-luminescent device and at least one TFT. Although not shown in FIG. 15, each subpixel may include a capacitor.

The organic EL display includes various pixel patterns according to the emission colors of the OLEDs, and red, green, and blue pixels may be included in the organic EL display.

Each red, green, and blue subpixel may include one or more TFTs and an OLED, as shown in FIG. 15.

Referring to FIG. 15, the TFT 30 may be formed on an insulating substrate 31. The TFT 30 is the same as the TFT 10 of FIG. 1, but the present invention is not limited thereto. Any TFT according to exemplary embodiments of the present invention may be used in the FPD.

A gate electrode 32 may be formed on the substrate 31, and a gate insulating film 33 covers the gate electrode 32. Source and drain electrodes 34 are separately formed on the gate insulating film 33.

An organic semiconductor film 35 may be formed to cover the source and drain electrodes 34.

The organic semiconductor film 35 includes source and drain regions 35b and a channel region 35a coupling the source and drain regions 35b.

A groove 36 may be formed in the semiconductor film 35 to isolate at least the channel region 35a from adjacent TFTs. No additional patterning process may need to be performed on the semiconductor film 35. Forming the groove 36 of an organic semiconductor may more effectively isolate the channel region 35a from adjacent TFTs.

As described above, the groove 16 may be simply formed using a laser ablation method. Moreover, other methods may be used to form the groove 36.

Since the pattern and depth of the groove 36 may be the same as in the foregoing embodiments, a detailed description thereof will not be discussed here.

After forming the organic semiconductor 35, a passivation film 38 may be formed to cover the TFT 30. The passivation film 38 may be a single or double layer formed of an organic material, an inorganic material, or a combination thereof.

A pixel electrode 41, which is an electrode of an OLED 40, may be formed on the passivation film 38, and a pixel defining film 39 may be formed thereon. An opening 39a may be formed in the pixel defining film 39, and an organic light emitting film 42 may be formed in the opening 39a.

The OLED 40 emits red, green, or blue light, when a current flows, to display part of an image. The OLED 40 includes the pixel electrode 41, which may be coupled to either the source or drain electrode 34 of the TFT 30, an opposing electrode 43, which may cover all pixels, and the organic light emitting film 42, which is located between the pixel electrode 41 and the opposing electrode 43.

The organic light emitting film 42 electrically insulates the pixel electrode 41 and the opposing electrode 43 from each other. These electrodes may apply voltages with opposite polarities to the organic light emitting film 42, thus enabling the organic light emitting film 42 to emit light.

The organic light emitting film 42 may be either a monomer or polymer organic film. A monomer organic film may be formed by stacking a hole injection layer (HIL), a hole transport layer (HTL), an emission layer (EML), an electron transport layer (ETL), and an electron injection layer (EIL) in a simple or complex structure. Various organic materials may be used, including copper phthalocyanine (CuPc), N,N'-Di (naphthalene-1-yl)-N,N'-diphenyl-benzidine (NPB), and tris-8-hydroxyquinoline aluminum (Alq3). The monomer organic film may be formed by vacuum deposition.

A polymer organic film may include an HTL and an EML. The HTL may be formed of polyethylenethioxythiophene (PEDOT), and the EML may be formed of a polymer organic material, such as a poly-phenylenevinylene (PPV)-containing material or a polyfluorene-containing material, by screen printing or inkjet printing.

The structure of the organic light emitting film 42 is not limited to the above description, and various other structures may be used.

The pixel electrode 41 may serve as an anode, while the opposing electrode 43 serves as a cathode. Alternatively, the pixel electrode 41 may serve as the cathode, and the opposing electrode 43 may serve as the anode.

The organic EL display of the present invention is not limited to the above-described structure, and various structures of organic EL displays may be applied.

Unlike the organic EL display, an LCD may include a lower alignment film (not shown) covering the pixel electrode 41.

Figure 16:
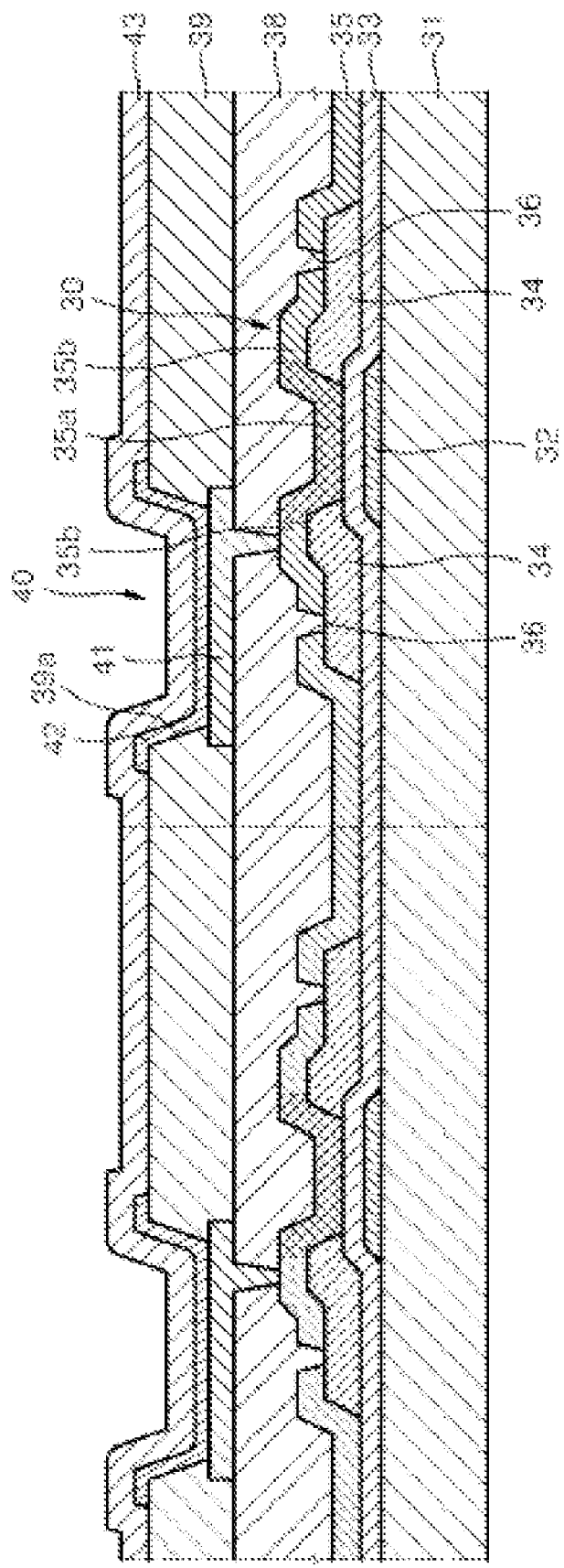
FIG. 16 shows a flat panel display according to an exemplary embodiment of the present invention.

The TFT of the present invention may be mounted on each subpixel as shown in FIG. 15, and it may be mounted on a driving circuit (not shown) that does not create images. FIG. 16 shows the TFT of the present invention included in adjacent subpixels of a flat panel display.

Also, the organic EL display may include a flexible plastic substrate.

The present invention may have the following advantages.

First, since a semiconductor film may be patterned using only a groove, an organic semiconductor film may not be appreciably damaged in a patterning process.

Second, dry or wet etching processes may be omitted, thus preventing degradation of active channel characteristics.

Third, since it may not be necessary to etch around the active channel, a manufacturing process may be shortened and manufacturing efficiency may be enhanced. Also, wet etching may be excluded, thus simplifying the manufacturing process and improving TFT characteristics.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor, comprising:
   a gate electrode;
   source and drain electrodes electrically insulated from the gate electrode; and
   a semiconductor active layer electrically insulated from the gate electrode and including:
   source and drain regions coupled to the source and drain electrodes, respectively, the source and drain electrodes being disposed between the gate electrode and the source and drain regions; and
   a channel region coupling the source and drain regions,
   wherein the semiconductor active layer is isolated by a groove from a semiconductor active layer of an adjacent thin film transistor, and a semiconductor film is arranged between the semiconductor active layer and the semiconductor active layer of the adjacent thin film transistor.

2. The thin film transistor of claim 1, wherein the groove has a form of a closed curve.

3. The thin film transistor of claim 2, wherein the channel region is located inside the closed curve.

4. The thin film transistor of claim 1, wherein the groove has a form of a pair of parallel lines.

5. The thin film transistor of claim 4, wherein the channel region is located between the pair of parallel lines.

6. The thin film transistor of claim 1, wherein a portion of the groove is substantially parallel to a line that is connected to at least the source region, the channel region, and the drain region.

7. The thin film transistor of claim 1, wherein a depth of the groove is less than or equal to a thickness of the semiconductor active layer.

8. The thin film transistor of claim 1, wherein a depth of the groove is greater than or equal to a thickness of the semiconductor active layer.

9. The thin film transistor of claim 1, wherein the semiconductor active layer is formed of an organic semiconductor.

10. The thin film transistor of claim 9, wherein the organic semiconductor includes at least one material selected from the group consisting of polythiophene; polyparaphenylenvinylene; polyparaphenylen; polyflorene; polythiophenevinylene; polythiophene-heterocyclic aromatic copolymer; pentacene, tetracene, or oligoacene of naphthalene; alpha-6-thiophene; oligothiophene of alpha-5-thiophene; metal-containing or metal-free phthalocyanin; pyromelitic dianhydride; pyromelitic diimide; perylenetetracarboxylic acid dianhydride; perylenetetracarboxylic diimide, and any derivatives thereof.

11. The thin film transistor of claim 1, wherein the semiconductor active layer is formed over the gate electrode.

12. The thin film transistor of claim 1, wherein the gate electrode is formed over the semiconductor active layer.

13. A method for manufacturing a thin film transistor comprising a gate electrode, source and drain electrodes electrically insulated from the gate electrode, and a semiconductor active layer electrically insulated from the gate electrode and including source and drain regions coupled to the source and drain electrodes, respectively, the source and drain electrodes being disposed between the gate electrode and the source and drain regions, and a channel region coupling the source and drain regions, the method comprising:
   forming the semiconductor active layer; and
   forming a groove in the semiconductor active layer that isolates the semiconductor active layer from a semiconductor active layer of an adjacent thin film transistor such that a semiconductor film is arranged between the semiconductor active layer and the semiconductor active layer of the adjacent thin film transistor.

14. The method of claim 13, wherein forming the groove comprises patterning the groove in a form of a closed curve.

15. The method of claim 14, wherein patterning the groove in the form of the closed curve comprises patterning the groove such that the channel region is located inside the closed curve.

16. The method of claim 13, forming the groove comprises patterning the groove in a form of a pair of parallel lines.

17. The method of claim 16, wherein patterning the groove in the form of the pair of parallel lines comprises patterning the groove such that the channel region is located between the pair of parallel lines.

18. The method of claim 13, wherein forming the groove comprises patterning the groove such that a portion of the groove is substantially parallel to a line that is connected to at least the source region, the channel region, and the drain region.

19. The method of claim 13, wherein forming the groove comprises forming the groove to a depth that is less than or equal to a thickness of the semiconductor film.

20. The method of claim 13, wherein forming the groove comprises forming the groove to a depth that is greater than or equal to a thickness of the semiconductor film.

21. The method of claim 13, wherein the semiconductor film is formed of organic semiconductor.

22. The method of claim 21, wherein the organic semiconductor includes at least one material selected from the group consisting of polythiophene; polyparaphenylenvinylene; polyparaphenylen; polyflorene; polythiophenevinylene; polythiophene-heterocyclic aromatic copolymer; pentacene, tetracene, or oligoacene of naphthalene; alpha-6-thiophene; oligothiophene of alpha-5-thiophene; metal-containing or metal-free phthalocyanin; pyromelitic dianhydride; pyromelitic diimide; perylenetetracarboxylic acid dianhydride; perylenetetracarboxylic diimide, and any derivatives thereof.

23. The method of claim 13, wherein forming the semiconductor active layer comprises forming the semiconductor active layer over the gate electrode.

24. The method of claim 13, further comprising forming the gate electrode over the semiconductor active layer.

25. The method of claim 13, wherein forming the groove in the semiconductor film is performed using a laser ablation method.

* * * * *